United States Patent [19]

Hague

[11] Patent Number: 4,857,778
[45] Date of Patent: Aug. 15, 1989

[54] PROGRAMMABLE UNIVERSAL ACTIVE FILTER

[75] Inventor: Yusuf A. Hague, San Jose, Calif.

[73] Assignee: Maxim Integrated Products, Sunnyvale, Calif.

[21] Appl. No.: 149,491

[22] Filed: Jan. 28, 1988

[51] Int. Cl.$^4$ .......................... H03K 5/00; H03H 7/01
[52] U.S. Cl. .................................. 307/521; 328/167; 330/109; 333/173
[58] Field of Search ...................... 328/167, 165, 151; 307/520, 521; 330/107, 109; 333/173

[56] References Cited

U.S. PATENT DOCUMENTS

| | | | |
|---|---|---|---|
| 3,795,877 | 3/1974 | Poole | 333/173 |
| 4,158,818 | 6/1979 | Lerner | 328/167 |
| 4,453,132 | 6/1984 | Stamler | 330/109 |

OTHER PUBLICATIONS

Kraus, "Voltage Controlled Universal Filters", Electronic Industry, vol. 8, No. 6, Jun. 1982, pp. 72–73.
Martin et al., "Switched-Capacitor Building Blocks . . . ", IEEE Trans. C&S., vol. CAS-28, No. 6, Jun. 1981, pp. 576–584.

Primary Examiner—Stanley D. Miller
Assistant Examiner—Timothy P. Callahan
Attorney, Agent, or Firm—Blakely, Sokoloff, Taylor & Zafman

[57] ABSTRACT

The invention relates to a microprocessor-programmable, universal active filter. The filter has an input section, an operational amplifier with two input nodes, a bandpass section, a lowpass section and control circuitry which, under clock control, periodically brings one of the inputs of the operational amplifier to within a low, d.c. offset voltage, approaching zero volts, of the other input. The output of the lowpass filter section is coupled to the input of the bandpass filter section and the lowpass section also has a feedback loop back to the bandpass section. The selectivity "Q", the gain, center frequency and the output characteristics, such as bandpass, lowpass, allpass, highpass or notch, of the filter may be selected using MOS switches under microprocessor control.

17 Claims, 4 Drawing Sheets

| $Q_1$ | $Q_2$ | A | B | C |
|---|---|---|---|---|
| 1 | 0 | $V_{OUT}$ | 0 | $V_{IN}$ |
| 0 | 1 | 0 | $V_{OUT}$ | 0 |

PROGRAMMABLE UNIVERSAL ACTIVE FILTER

BACKGROUND OF THE INVENTION

A universal, programmable active filter on a single silicon chip is an active filter which, by switchable programming through switches or with controllers or a microcomputer, or by application of control voltages to appropriate pins of the integrated circuit. The control signals are decoded on chip and applied to MOS devices operated as switches. This programming can be used to change the filter from one type of output such as a bandpass, to another type, such as allpass, lowpass, highpass or notch. Not only may the type of output of the filter be changed by software, but the filter's selectivity "Q", its gain, its center frequency (or cutoff frequency), and other parameters also may be changed. By the proper application of o and off signals to the gates of these MOS devices, capacitors and/or resistors may be switched in and out of the filter circuit, all as well known in the art. Therefore, resistor or capacitor values (or the parameters of a resistor/capacitor pair) may be varied using a microprocessor program which limits control pulses to these MOS gates.

Universal, programmable active filters are well known. Most employ an operational amplifier. Since the potential difference between the two input nodes of an operational amplifier must be close to zero volts, some form of resistive feedback loop is necessary from the output to the negative input. A parallel coupled resistor can serve this purpose. It allows the flow of d.c. current from the inverting input of the operational amplifier to the output. However, resistors are difficult to integrate on a single silicon chip in a manner where they can be programmed into and out of the circuit using MOS switches. Once the resistors are formed on the circuit, they have a fixed resistance. Switching resistors in and out using MOS switches causes distortions and inaccuracies in resistance values because the MOS devices themselves introduce unwanted cumulative resistance values which are difficult to control. To avoid this problem, prior art filters, for example the commercially available MF-10 programmable filter, uses external resistors rather than on chip resistors.

However, it is highly preferable for ease of use to have all necessary components directly on the chip. One way for providing the necessary feedback entirely on the chip without resistors would be to substitute capacitors which are easier to fabricate in a small area in an integrated circuit design. Capacitors can accurately be switched in and out of the circuit using MOS switches. However, using a parallel-coupled capacitor instead of a resistor does not permit d.c. current to flow between the input and the output terminals of the amplifier. This prevents the inverting input node from periodically being brought back to the d.c. offset voltage of the operational amplifier, as required.

One compromise technique which has been used is the provision of an additional large resistor in parallel with the capacitor coupled across the amplifier to permit d.c. current to flow to the inverting node. This allows a d.c. bias to be established at the inverting input node of the operational amplifier, placing a d.c. potential at that node. However, the integration of this circuit into a monolithic integrated circuit requires a large resistor and hence requires significant silicon real estate. Further, the value of such a large resistor is difficult to control repeatably.

The alternative is to use a switched capacitor instead of a resistor in parallel with the fixed capacitor. This technique has been described in an article entitled "An Electrically Programmable Switched Capacitor Filter" by David J. Allstot, et al., IEEE J. Solid State Circuits, Vol. SC-14, pp. 1034-1041, December, 1979. FIG. 2 of the Allstot, et al. article shows a circuit using a parallel connected switched capacitor to establish a d.c. bias voltage at the inverting input node.

The problem with these prior art circuits is that they can only be used to implement bandpass filters. They do not operate satisfactorily in the implementation of a lowpass, highpass, allpass or notch filters. When designing universal active filters to be integrated on a single silicon chip, it is far preferable to have a single design which can operate, selectively, as a lowpass, highpass, bandpass, allpass or notch filter. The filter of this invention is just such a universal filter. Furthermore, the use of the above prior art technique results in the degradation of Q and center frequency accuracy, a problem not encountered in the filters of this invention.

The technique employed by this invention to overcome the above difficulties is the use of control circuitry which periodically, under clock control, brings the inverting node of the operational amplifier back to a voltage approaching zero without need of any large external or integrated resistors. The circuit of this invention has the advantage of being able to operate at very low operating clock frequencies, such as 1 hz, while providing a high degree of d.c. gain stability over a large temperature range. The d.c. offsets at all nodes are satisfactory. The programmable universal filters of this invention can be reconfigured by a microprocessor to serve a wide variety of needs such lowpass, bandpass, allpass and notch filters.

BRIEF DESCRIPTION OF THE INVENTION

In its essentials, the universal active filter of this invention has an input section and control circuit coupled to the input section, the control circuit including an operational amplifier having two inputs, one of which is coupled to the input section, and an output. The control circuit is capable, during a portion of the operating cycle of the operational amplifier, of bringing the one input of the amplifier to within an offset voltage of the other input. If the positive input is at zero volts, for example, and the offset voltage of the operational amplifier is 5 mv, then the negative input will approach 5 mv.

A clock is coupled to the control circuit for timing the control circuit to synchronize the switching of the input of the amplifier with the operation of the filter.

A bandpass section of the filter has its input coupled to the output of the control circuit, and a feedback loop coupling the bandpass section to the inverting input of the operational amplifier in the input section. The bandpass section also has an output. The lowpass section of the filter has an input coupled to the output of the bandpass section, has a feedback loop coupling the lowpass section to the bandpass section, and has an output.

In a preferred embodiment, the control circuit includes a capacitor and three switches, the first in series with the capacitor, the second in parallel with the series connected capacitor and switch, and the third coupling the connection point of the capacitor and its series-connected switch to a point of fixed potential, such as ground. This control circuit is coupled between the the output and the inverting node of the operational amplifier.

BRIEF DESCRIPTION OF THE DRAWINGS

The operation of this and other embodiments of the invention will be apparent from the more detailed description which follows, making reference to the drawings in which.

DESCRIPTION OF THE PREFERRED EMBODIMENTS

Figures 1, 2:
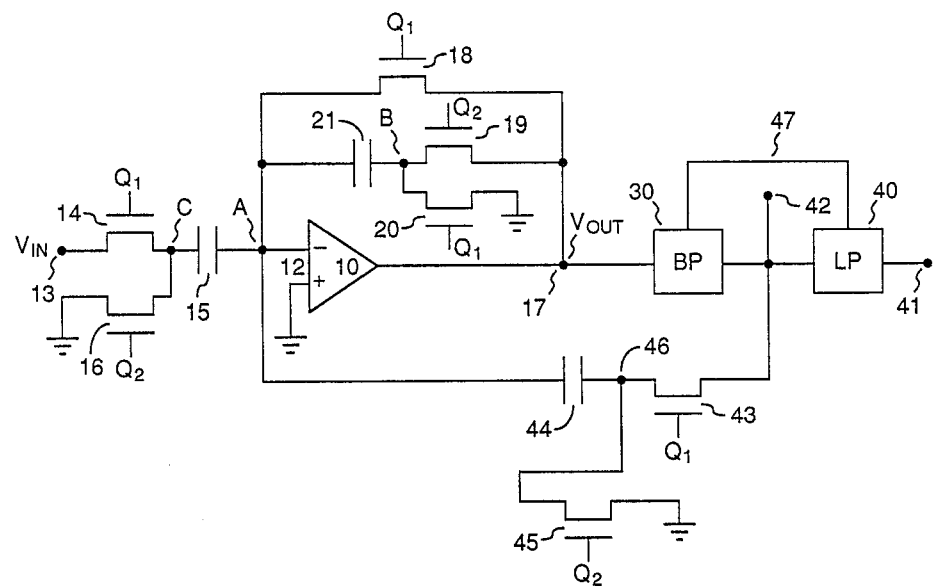
FIG. 1 is a circuit schematic of a preferred embodiment of the filter of the invention.
FIG. 2 is a table showing the d.c. voltages at three points of the circuit of FIG. 1 at the possible clock pulse combinations.

Referring to FIG. 1, the control circuit of the invention includes operational amplifier 10 having a negative input terminal A and positive input terminal 12 biased to a suitable potential. The input signal to the filter, $V_{in}$, enters through input terminal 13 through the series-connected MOS device 14 which acts as a switch under the control of a clock pulse $Q_1$ connected to the gate of MOS device 14. The input signal passes through capacitor 15 connected in series between MOS device 14 and the input terminal A to amplifier 10. This input terminal A is also connected through capacitor 15 and MOS device 16, controlled by clock pulse $Q_2$, to ground, as shown.

The control circuit which, under clock control, periodically connects terminal A to the output terminal 17 of the operational amplifier, includes three MOS devices 18, 19 and 20, operated as switches under control of the clock pulses $Q_1$, $Q_2$ and $Q_1$, respectively. MOS device 19 is connected in series with capacitor 21. MOS device 18 is parallel-coupled with the series-connected MOS device 19 and capacitor 21. The third MOS device 20 couples node B, between MOS device 19 and capacitor 21, to ground under the control of clock pulse $Q_1$.

The output node 17 of amplifier 10 is coupled to a bandpass filter section 30, which in turn has its output coupled to the input of lowpass filter section 40. Node 41 is the output from lowpass filter section 40. The output node 42 of the bandpass filter section 30 is coupled through a feedback loop including MOS device 43 (controlled by clock pulse $Q_1$) and capacitor 44 connected in series, back to node A. MOS device 45, controlled by clock pulse $Q_2$, grounds the connection point between MOS device 43 and capacitor 44 under the control of clock pulse $Q_2$.

The control circuit in FIG. 1, including MOS devices 18, 19 and 20 and capacitor 21 establishes its own d.c. bias at node A. When the clock pulse $Q_1$ on MOS device 18 is a 1, turning device 18 on, the output 17 of amplifier 10 is essentially shorted to its negative input node A. This forces node A to a voltage approaching zero volts in order to establish the proper d.c. bias voltage at node A. The actual voltage at node A when clock $Q_1$ is a 1 is the offset voltage of amplifier 10, which is generally in the range between $-20$ and $+20$ mv.

The clock pulses necessary to create this d.c. biasing are shown in FIG. 2. Clock pulses $Q_1$ and $Q_2$ are never 1 at the same time, as shown in the table of FIG. 2. Referring both to FIG. 1 and the table of FIG. 2, when $Q_1$ is a 1 while $Q_2$ is 0, as shown in the first line of the table of FIG. 2, the control circuit establishes at node A the required d.c. bias voltage approaching zero volts, which is actually the offset voltage of the amplifier 10. Node A is forced, as a result of MOS device 18 being on, to be equal to the voltage $V_{out}$ at the output node 17 of the amplifier. Node B is connected to ground through MOS device 20, which also is turned on by clock pulse $Q_1$ being a 1. At this time, the offset voltage of amplifier 10 is stored across capacitor 21. During this clock cycle ($Q_1$ is 1), node C is connected to the input terminal $V_{in}$ at node 13 through MOS device 14, which also is turned on when clock pulse $Q_1$ is a 1. Thus capacitor 15 is charged to the input voltage $V_{in}$ and node C is at the input voltage $V_{in}$ of the circuit.

When $Q_1$ is 0 and $Q_2$ is 1, shown in the second line of the table of FIG. 2, MOS device 16 is turned on and node C is grounded. At the same time, MOS device 19 is turned on, connecting node B to $V_{out}$ (instead of to ground). During this clock cycle, capacitor 21 charges to $V_{out}$, cancelling the offset voltage of the amplifier 10 at output node 17. Node C is at 0 volts because MOS device 16 is turned on.

The voltage differential at the inputs of amplifier 10 is amplified, producing an output voltage $V_{out}$ equal to $V_{in}$ times the ratio of the capacitance of capacitor 15, $C_{15}$, divided by the capacitance of capacitor 21, $C_{21}$. This output voltage $V_{out}$ is free of the offset voltage of the amplifier. The switching action (caused by periodically turning MOS device 18 on and off during the cycles of clock $Q_1$) restores the proper d.c. bias at node A. The input signal $V_{in}$ is amplified by the ratio $C_{15}/C_{21}$ of the two capacitances, described above. If it desirable to change the sign of the amplifier gain to the ratio $C_{14}/C_{21}$, all that is required is to switch the clock signal connected to MOS device 14 with that connected to MOS device 16.

The control circuit described above needs to be synchronized with the bandpass filter 30 and lowpass filter 40 through a feedback loop comprising MOS device 43 (controlled by clock $Q_1$) and capacitor 44. The required feedback is established through MOS device 43 and capacitor 44 back to node A together with MOS device 45 connected to ground, all as shown in FIG. 1. The lowpass filter section 40 and bandpass section 30 are connected together by feedback loop 47.

When $Q_1$ is 1 and $Q_2$ is 0, node 46 sees the change in voltage at node 42, called $V_{42}$, less 0 volts. This change in voltage is amplified by $C_{44}/C_{21}$. The output voltage at node 17 thus becomes $$(V_{42} \times C_{44}/C_{21}) + (V_{in} \times C_{15}/C_{21}).$$

This output voltage can be positive or negative depending upon the clock phasing chosen for MOS devices 14, 16, 43 and 45. In the example in FIG. 2, this voltage is negative.

The selectivity of the filter of FIG. 1, commonly known as "Q", is controlled by the ratio of $C_{44}/C_{21}$. For a programmable filter, the "Q" needs to be variable.

This is accomplished, as is well known in the art, by employing for $C_{44}$ a bank of capacitors selected by MOS switches. Similarly $C_{15}$ controls the gain of the filter, and it also is usually made up of a bank of capacitors switched in and out by MOS switches for selecting the desired value. These techniques are well established. In this embodiment, the notch location is identical to the center frequency of the bandpass section. The filter of FIG. 1 is capable of providing a bandpass output at node 42 and a lowpass output at 41.

Figure 3:
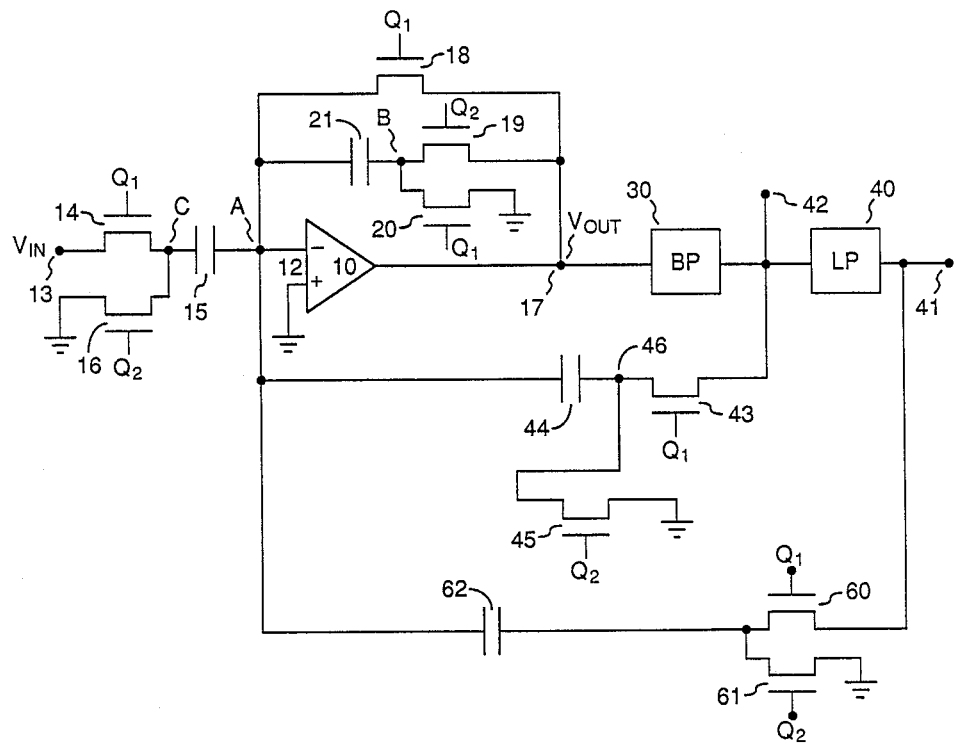
FIG. 3 is a circuit schematic of another embodiment of the invention having a feedback loop from the lowpass filter.

Another embodiment of the invention, shown in FIG. 3, uses as an input an additional feedback loop including MOS devices 60 and 61 and capacitor 62 connected in series between the output 41 of lowpass filter 40 and node A. Again, this loop is controlled by the same clock pulses, being turned on when $Q_1$ is 1 because MOS device 60 is then on, and being grounded when $Q_2$ is 1 because MOS device 61 is connected to ground and MOS device 60 is switched off, as shown in FIG. 3. Again, the selectivity "Q" is controlled by $C_{44}/C_{21}$. $C_{15}$, which controls gain, is also the same as in FIG. 1. $C_{62}$ can also be selected from a bank of capacitors and is used to partially select or modify the selectivity "Q" and the center frequency of the filter.

In the filter embodiment shown in FIG. 3, the feedback loop 47 illustrated in FIG. 1 (and which will be shown in more detail in FIG. 4) can also be used. The addition of this loop results in a lowpass, bandpass or notch filter with characteristics, such as selectivity "Q" and center frequencies which are different from those found in the filter of either FIG. 1 or that of FIG. 3 without the added loop. With this additional loop, the notch is located at a frequency different from the center frequency of the filter. The lowpass output is at node 41, the bandpass output at 42.

If a highpass output is desired from the embodiment shown in FIG. 3, it may be taken off of node 17. However, as will be explained in more detail in connection with FIG. 4, the output signal of node 17 is not continuous, therefore requiring a sample/hold circuit connected to node 17 to provide a continuous highpass output signal.

Figure 4:
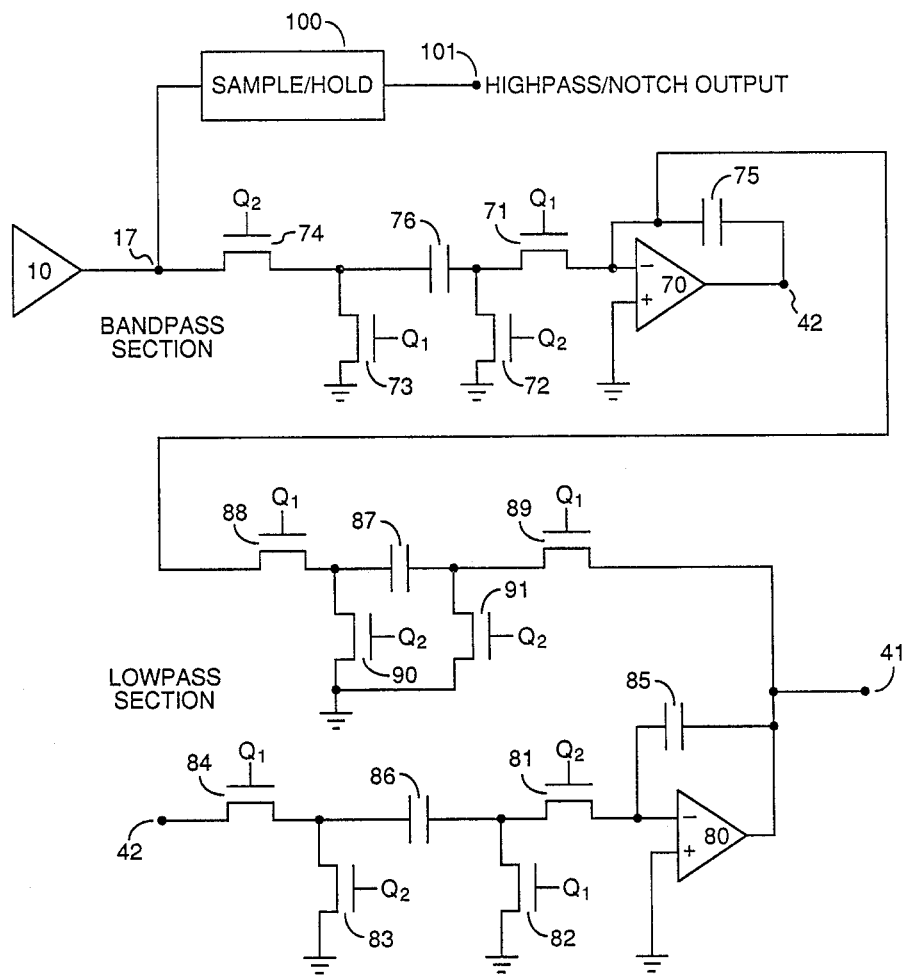
FIG. 4 is circuit schematic of the embodiment of the filter shown in FIG. 1, but showing more detail of the bandpass and lowpass sections and showing a highpass-/notch output.

FIG. 4 shows the lowpass and bandpass filter sections of the invention in more detail. Each section comprises an additional operational amplifier, amplifier 70 in the bandpass section and amplifier 80 in the lowpass section. These sections are also controlled to operate synchronously with the control circuit of the invention using MOS devices 71, 72, 73 and 74 in the bandpass section and MOS devices 81, 82, 83 and 84 in the lowpass section, each controlled by the clock pulses as indicated. These two filter sections operate with opposite clocks because MOS devices 71 and 73 are controlled by clock $Q_1$ and MOS devices 81 and 83 are controlled by clock $Q_2$. Conversely, MOS devices 82 and 84 are controlled by clock $Q_1$ and MOS devices 72 and 74 are controlled by clock $Q_2$. Capacitors 75 and 85 control the differential amplification of amplifiers 70 and 80, respectively, in the manner described above for capacitor 21 (shown in FIG. 1) for amplifier 10. Capacitor 75 across amplifier 70 of the bandpass filter section serves to hold the required voltage across the amplifier, which is updated when $Q_1$ is 1 because MOS device 71 is turned on. The same is true of capacitor 85 in the lowpass filter section with respect to amplifier 80, except that it is updated when $Q_2$ is 1 when MOS device 81 is turned on. Each of these two filter sections operate as an integrator. The bandpass integrator has two input signals, the signals at nodes 17 and 41; the lowpass integrator has only one input signal at node 42.

The feedback loop between the lowpass and bandpass sections, illustrated in FIG. 1 as loop 47, is shown in more detail in FIG. 4. This feedback loop is connected between node 41 and the inverting input of amplifier 70, and comprises capacitor 87 and MOS devices, 88, 89, 90 and 91, controlled in synchronism with the rest of the filter by clock pulses $Q_1$ and $Q_2$, as illustrated. When clock pulse $Q_2$ turns high while $Q_1$ is low, MOS devices 90 and 91 are conducting, grounding both sides of capacitor 114. When $Q_1$ goes high when $Q_2$ is low, MOS devices 88 and 89 are conducting, thus completing the loop.

In a preferred embodiment of the invention, the values of capacitors 76, 86 and 87 are the same; capacitors 75 and 85 are also equal to each other, but not necessarily equal to the capacitances of capacitors 76, 86 and 87. The ratio between capacitors 75 and 76, together with the choice of the clock frequency of clocks $Q_1$ and $Q_2$, control the center frequency or the cut off of frequency of the filter.

For a programmable filter, the center frequency needs to be under user control. Therefore capacitor sets 76, 86, and 87, and also capacitor sets 75 and 85, are all made up of banks of capacitors having different, selectable capacitances values which can be selected by MOS switches.

In some applications, a highpass or notch output is required from the filter. The filter can be programmed to be highpass or notch, and in either case, the output is available at node 101. Referring to FIGS. 3 and 4, if a highpass output is required at node 101, the feedback loop shown in FIG. 3 (but not in FIG. 4) containing capacitor 62 is switched into the circuit using MOS switching devices not shown. The feedback loop between node 41 in FIG. 4 and the input to amplifier 70 in the bandpass section is disconnected also by using MOS switching devices not shown. If a notch output is desired from node 101 on the other hand, the feedback loop connections are reversed, turning the loop between node 41 and amplifier 70 in FIG. 4 on and the loop between node 41 and node A in FIG. 3 off.

The output signal at node 17 in FIG. 4 is not continuous, because when $Q_1$ is 1, the output voltage at node 17 is forced to the offset voltage of the amplifier (the correct voltage is available at node 17, however, when $Q_2$ is 1 and $Q_2$ is 0). This may be undesirable in some applications. Therefore, to provide a continuous output signal level, a sample/hold circuit 100 is coupled to the output of the operational amplifier 10, as shown in FIG. 4. This circuit, well known in the art, holds the correct output signal level from amplifier 10 which is present at the end of the clock cycle just prior to when $Q_1$ becomes 1, before it decays to the offset voltage when $Q_1$ switches to 1. If this sample/hold circuit weren't employed, the output voltage at node 17 would return to the offset voltage half of the time, which is usually undesirable. The notch on highpass output appears at node 101.

Figure 5:
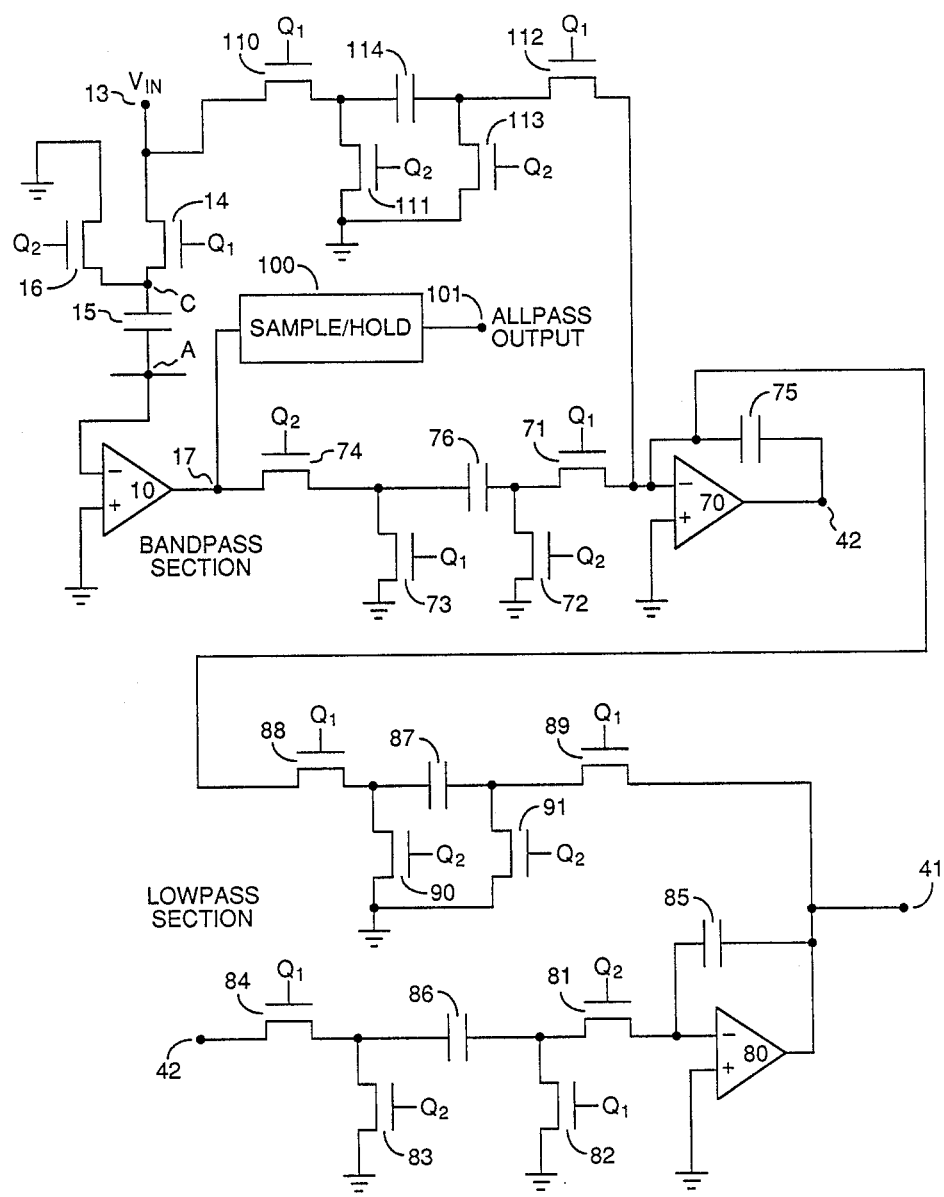
FIG. 5 is a circuit schematic illustrating an embodiment of the invention having an allpass output.

The circuit of an embodiment of this invention which provides an allpass output is shown in FIG. 5. Except for an additional feedback loop between the input section of amplifier 10 at node 13 and the inverting input to amplifier 70 in the bandpass section, this circuit is the same as the circuit shown in FIG. 4. This feedback loop includes capacitor 114 and MOS devices 110, 111, 112 and 113. When clock pulse $Q_2$ turns high while $Q_1$ is low, MOS devices 111 and 113 are conducting, grounding both sides of capacitor 87. When $Q_1$ goes high when $Q_2$ is low, MOS devices 110 and 112 are conducting, thus completing the loop. The allpass output of the circuit of FIG. 5 appears at node 101 identified as the allpass output. In this embodiment, however, only an allpass output is possible, not a notch or highpass output. Another method of achieving an allpass filter is to connect $V_{in}$ at node 13 to the terminal of MOS device 73 shown grounded in FIG. 5, instead of using the feedback loop consisting of capacitor 114 and MOS devices 110, 111, 112 and 113. That terminal of MOS device 73 is then no longer connected to ground.

Figure 6:
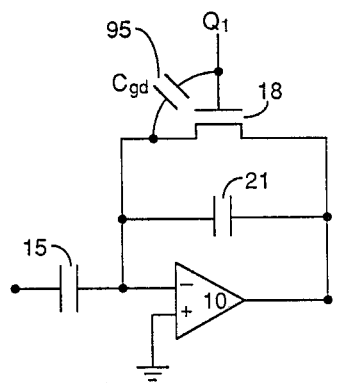
FIG. 6 is a circuit schematic illustrating a feature of the operation of the circuit of the invention.

One advantage of the control circuit of this invention is that offset voltages can be kept very small, as usually desired. One source of offset voltage is the charge injection from the clock signal voltage $Q_1$ connected to the gate of the MOS device 18. However, when a clock makes a transition from $Q_1$ to $Q_2$, it injects only a very small charge into to node A (shown in FIG. 1). Referring to FIG. 6, the gate-to drain capacitance 95 of MOS device 18, termed $C_{gd}$, is very small when compared to the capacitances of capacitors 15 or 21, shown in FIG. 1. $C_{gdx}$ needs to be kept small to minimize charge injection into node A. This injection can be further minimized by using a dummy switch with the complementary clock on it, or by using a P-channel MOS device in parallel with the N-channel device and driven by the complementary clock.

All MOS devices used in the invention may be either P-channel or N channel. The logic illustrated dictates the use of N channel devices. However, CMOS is the preferred technology for the filters of the invention. Using CMOS, each illustrated MOS device becomes two devices, one N-channel and one P-channel, connected in parallel as is well known in the art, with the normal input connected to the gate of one MOS device and its complement connected to the other.

While the invention has been described in several preferred embodiments, those skilled in the art will see that many modifications may be made to the embodiments shown without departing from the spirit and scope of the invention claimed in the claims which follow.

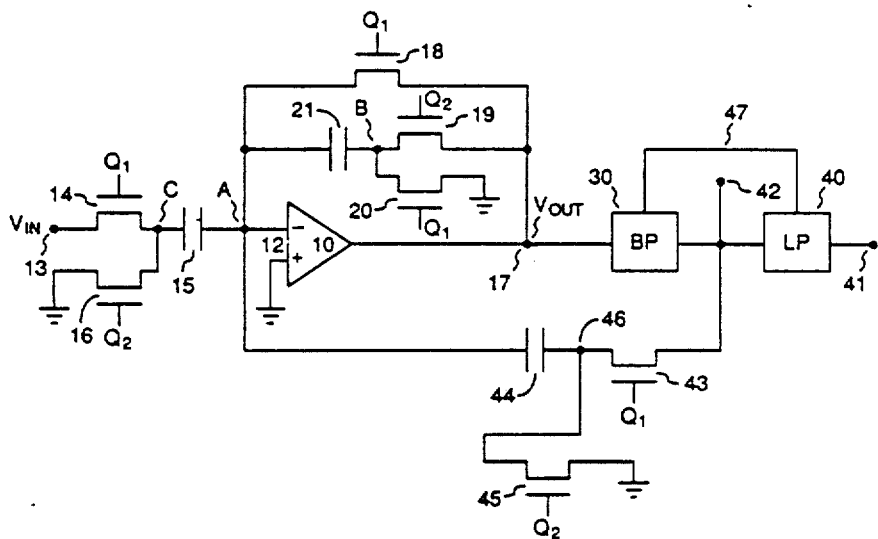

I claim:

1. A programmable universal active filter comprising:
    an input section including an input terminal and switching means for coupling and decoupling said input terminal to the filter;
    an operational amplifier having an operating cycle and two inputs, one of which is coupled to said input section and the other of which is adapted to be connected to a voltage source, and an output,
    control circuitry having its input coupled to said input section, and an output, said control circuitry being capable during a portion of the operating cycle of the amplifier, of bringing said one input substantially to within an amplifier offset voltage of the voltage connected to the other input;
    a bandpass section having switching means capable of synchronous operation with said control circuit and having an output, an input coupled to the output of said control circuitry, a second input, and a first feedback loop coupling said output of said bandpass section to said one input of said operational amplifier;
    a lowpass section having switching means capable of synchronous operation with said control circuitry and having an input coupled to the output of said bandpass section, and an output; and
    a second feedback loop coupling either the output of said lowpass section to said one input of said operational amplifier or coupling the output of said lowpass section to said second input of said bandpass section.
    clock means coupled to said switching means in each of said input, bandpass and lowpass sections and also coupled to said control circuitry for timing the control circuitry to synchronize the switching of said input, bandpass and lowpass sections of the filter.

2. The programmable, universal active filter of claim 1 further characterized by said second feedback loop coupling the output of said lowpass section to said one input of said operational amplifier.

3. The programmable, universal active filter of claim 1 further characterized by said second feedback loop coupling the output of said lowpass section to said second input of said bandpass section.

4. The programmable universal active filter of claim 1 further characterized by said control circuitry including a parallel circuit which includes a first switch in series with a capacitor and a second switch in parallel with the series-coupled capacitor and first switch, said parallel circuit being coupled between said one input and said output of said operational amplifier.

5. The programmable universal active filter of claim 2 further characterized by said control circuitry including a first switch in series with a capacitor and a second switch in parallel with the series-coupled capacitor and first switch, said control circuitry being coupled between said one input and the output of said operational amplifier.

6. The programmable universal active filter of claim 3 further characterized by said control circuitry including a first switch in series with a capacitor and a second switch in parallel with the series-coupled capacitor and first switch, said control circuitry being coupled between said one input and the output of said operational amplifier.

7. The programmable, universal active filter of claim 1 wherein all of said switching means are MOS devices.

8. The programmable, universal active filter of claim 2 wherein all of said switching means are MOS devices.

9. The programmable, universal active filter of claim 3 wherein all of said switching means are MOS devices.

10. The programmable, universal active filter of claim 4 wherein all of said switches are MOS devices.

11. The programmable, universal active filter of claim 5 wherein all of said switches are MOS devices.

12. The programmable, universal active filter of claim 6 wherein all of said switches are MOS devices.

13. The programmable, universal active filter of claim 3 further characterized by the addition of a third feedback loop coupled between said output of said lowpass section and said one input of the operational amplifier.

14. The programmable, universal active filter of claim 3 further characterized by the addition of a third feedback loop between said input terminal of said input section and one input of a second operational amplifier in said bandpass section.

15. The programmable, universal active filter of claim 1 further characterized by said first feedback loop having a first switch series coupled to a capacitor and a second switch coupling the coupling point between said first switch and said capacitor to a point of fixed potential.

16. The programmable, universal active filter of claim 13 further characterized by said third feedback loop having a first switch in series with a capacitor and a second switch coupled between a point of fixed potential and a point between said first switch and said capacitor.

17. The programmable, universal active filter of claim 14 further characterized by said third feedback loop having two series-connected switches with a capacitor in between them, and two additional switches coupling points on each side of said capacitor to a point of fixed potential.

* * * * *

UNITED STATES PATENT AND TRADEMARK OFFICE
CERTIFICATE OF CORRECTION

PATENT NO. : 4,857,778
DATED : 08/15/89
INVENTOR(S) : Haque

Page 1 of 2

It is certified that error appears in the above-identified patent and that said Letters Patent is hereby corrected as shown below:

The title page should be deleted to appear as per attached sheet.

col. 1, Line 19 delete "o" insert --on--

Signed and Sealed this

Ninth Day of October, 1990

Attest:

HARRY F. MANBECK, JR.

*Attesting Officer*   *Commissioner of Patents and Trademarks*

United States Patent [19]

Haque

[11] Patent Number: 4,857,778
[45] Date of Patent: Aug. 15, 1989

[54] PROGRAMMABLE UNIVERSAL ACTIVE FILTER

[75] Inventor: Yusuf A. Haque, San Jose, Calif.

[73] Assignee: Maxim Integrated Products, Sunnyvale, Calif.

[21] Appl. No.: 149,491

[22] Filed: Jan. 28, 1988

[51] Int. Cl.⁴ ............................ H03K 5/00; H03H 7/01
[52] U.S. Cl. .................................... 307/521; 328/167; 330/109; 333/173
[58] Field of Search .................. 328/167, 165, 151; 307/520, 521; 330/107, 109; 333/173

[56] References Cited

U.S. PATENT DOCUMENTS

| | | | |
|---|---|---|---|
| 3,795,877 | 3/1974 | Poole | 333/173 |
| 4,158,818 | 6/1979 | Lerner | 328/167 |
| 4,453,132 | 6/1984 | Stamler | 330/109 |

OTHER PUBLICATIONS

Kraus, "Voltage Controlled Universal Filters", Electronic Industry, vol. 8, No. 6, Jun. 1982, pp. 72-73.
Martin et al., "Switched-Capacitor Building Blocks...", IEEE Trans. C&S., vol. CAS-28, No. 6, Jun. 1981, pp. 576-584.

*Primary Examiner*—Stanley D. Miller
*Assistant Examiner*—Timothy P. Callahan
*Attorney, Agent, or Firm*—Blakely, Sokoloff, Taylor & Zafman

[57] ABSTRACT

The invention relates to a microprocessor-programmable, universal active filter. The filter has an input section, an operational amplifier with two input nodes, a bandpass section, a lowpass section and control circuitry which, under clock control, periodically brings one of the inputs of the operational amplifier to within a low, d.c. offset voltage, approaching zero volts, of the other input. The output of the lowpass filter section is coupled to the input of the bandpass filter section and the lowpass section also has a feedback loop back to the bandpass section. The selectivity "Q", the gain, center frequency and the output characteristics, such as bandpass, lowpass, allpass, highpass or notch, of the filter may be selected using MOS switches under microprocessor control.

17 Claims, 4 Drawing Sheets